United States Patent [19]

Nakamura

[11] Patent Number: 4,667,212

[45] Date of Patent: May 19, 1987

[54] INTEGRATED OPTICAL AND ELECTRIC CIRCUIT DEVICE

[75] Inventor: Masaru Nakamura, Kawaguchi, Japan

[73] Assignee: Kabushiki Kaisha Toshiba, Kawasaki, Japan

[21] Appl. No.: 753,161

[22] Filed: Jul. 9, 1985

[30] Foreign Application Priority Data

Sep. 3, 1984 [JP] Japan ................................ 59-182801

[51] Int. Cl.$^4$ ...................... H01L 31/12; H01L 31/16
[52] U.S. Cl. ....................................... 357/19; 357/40; 357/41
[58] Field of Search ...................... 357/19, 17, 30, 41, 357/40, 58

[56] References Cited

U.S. PATENT DOCUMENTS

| | | | |
|---|---|---|---|
| 3,879,606 | 4/1975 | Bean | 250/227 |
| 3,914,137 | 10/1975 | Huffman et al. | 148/175 |
| 4,396,932 | 6/1983 | Alonas et al. | 357/39 |
| 4,490,735 | 12/1984 | Schwaderer | 357/41 |

FOREIGN PATENT DOCUMENTS

| | | | |
|---|---|---|---|
| 0048146 | 3/1982 | European Pat. Off. | |
| 0066788 | 5/1979 | Japan | 357/19 |
| 0006480 | 1/1981 | Japan | 357/17 |
| 1493976 | 12/1977 | United Kingdom | |

OTHER PUBLICATIONS

Matsueda et al., "Integrated Optoelectronic Structure", Conference: International Electron Devices Meeting, Dec. 7-9, 1981, pp. 272-275.
Proceedings of the IEEE, vol. 27, "Optical Interconnections for VLSI Systems", J. W. Goodman et al., pp. 850, 859-860, (1984).
Conference Digest, International Commission for Optics, (ICO 13), pp. 2-3, (1986), "Optical Interconnections in Microelectronics", J. W. Goodman.
Applied Optics, vol. 23, No. 6, Mar. 1984, pp. 779-781, Optical Society of America, New York, U.S.; H., Matsueda et al.: "Monolithic Integration of a Laser Diode, Photo Monitor, and Electric Circuits, on a Semi-Insulating GaAs Substrate".
IEEE Journal of Quantum Electronics, vol. QE-17, No. 8, Aug. 1981, pp. 1539-1546, IEEE, New York, U.S.; E. H. Hara et al.: "A High Speed Opteolectronic Matrix Switch using Heterojunction Switching Photodiodes".
Patents Abstracts of Japan, vol. 6, No. 155, (E-125) [1033], 17th Aug. 1982; & JP-A-57 76 883, (Tokyo Shibaura Denki K.K.), 14-05-1982.
Electronics Letters, vol. 18, No. 2, Jan. 1982, pp. 72-74, London, GB; A. C. Carter et al.: "Monolithic Integration of Optoelectronic, Electronic and Passive Components in GaAlAs/GaAs Multilayers".
IEEE Journal of Solid-State Circuits, vol. SC-16, No. 4, Aug. 1981, pp. 286-293, IEEE, New York, U.S.; J. Ueda et al.: "An Optically Coupled Crosspoint Array with High dv/dt Capability and High Gate Sensitivity".
Applied Physics Letters, vol. 44, No. 10, May 1984, pp. 941-943, American Institute of Physics, New York, U.S.; N. Bar-Chaim et al.: "Monolithic Optoelectronic Integration of a GaAlAs Laser, a Field-Effect Transistor, and a Photodiode".

Primary Examiner—James W. Davie
Assistant Examiner—Georgia Y. Epps
Attorney, Agent, or Firm—Oblon, Fisher, Spivak, McClelland & Maier

[57] ABSTRACT

An integrated optical and electric circuit device in which a semiconductor light emitting device is formed in a semiconductor integrated circuit substrate on which circuit units like logic circuits are integrated. The semiconductor light emitting device is activated by a common electric signal such as a clock signal to emit a common light signal. This common light signal transmits through the semiconductor substrate and reaches each circuit unit. A semiconductor light detecting device formed in the semiconductor integrated circuit substrate is coupled to each circuit unit. The semiconductor light detecting device is responsive to the common light signal to bring the corresponding circuit unit into a common signal receiving state. With this arrangement, a metal interconnection for the common signal which is to be simultaneously distributed to the circuit units becomes unnecessary.

16 Claims, 6 Drawing Figures

INTEGRATED OPTICAL AND ELECTRIC CIRCUIT DEVICE

BACKGROUND OF THE INVENTION

The present invention relates to an integrated optical and electric circuit device in which optical devices and electric devices are integrated on a semiconductor substrate.

The degree of integration of a semiconductor integrated circuit is increasing year after year and memories having a few megabits on a chip of a few square millimeters have been developed recently. At present, integrated circuits have problems such as signal delay due to an increase in the length of electrical interconnections and in load in a high-density packing state, and an increase in designing and manufacturing costs due to interconnection complications.

In integrated digital circuits, a clock signal is a most fundamental signal in operation. Although it is necessary in a chip to simultaneously distribute the clock signal (common signal of a system) to logic circuit units, it is difficult to attain such a simultaneous distribution of the clock signal under the high-density packing state due to the foregoing signal delay. Since the clock signal is supplied to each logic circuit unit, the ratio of an area required for the interconnection of the clock signal in the chip to an area of another circuit interconnection becomes large, causing an obstacle to realize a very high density integration.

Summary of the Invention

It is an object of the present invention to provide an improved semiconductor integrated circuit device suitable for high density packing.

Another object of the invention is to provide a semiconductor integrated circuit device which is arranged so as to reduce the signal delay and the length of interconnections.

Still another object of the invention is to provide a semiconductor integrated circuit device in which metal interconnections to supply a common signal to circuit units are unnecessary.

An integrated optical and electric circuit device of the present invention comprises: a semiconductor integrated circuit substrate in which a plurality of circuit units are integrated near a major surface of the substrate, the substrate having a property which allows light to be transmitted therethrough and the circuit units being arranged to receive a common signal; at least one semiconductor light emitting device formed in the semiconductor integrated circuit substrate, which is activated by a common signal source to emit light passing through the semiconductor substrate; and semiconductor light detecting devices which are respectively coupled to the circuit units and are formed in the semiconductor integrated circuit substrate, each light detecting device setting the corresponding circuit unit into a common signal receiving state in response to the light from the semiconductor light emitting device.

Therefore, according to the present invention, by integrating optical devices in an integrated circuit substrate integrally with circuit units, the common signal of the circuit units such as clock pulses can be essentially at the same time distributed to the whole chip by means of optical transmission without using any particular electrical interconnection. Since the interconnection for the distribution of the common signal is unnecessary, a degree of freedom in designing an integrated circuit increases and the pattern layout is made extremely easy.

DETAILED DESCRIPTION OF THE PREFERRED EMBODIMENTS

Figure 1:
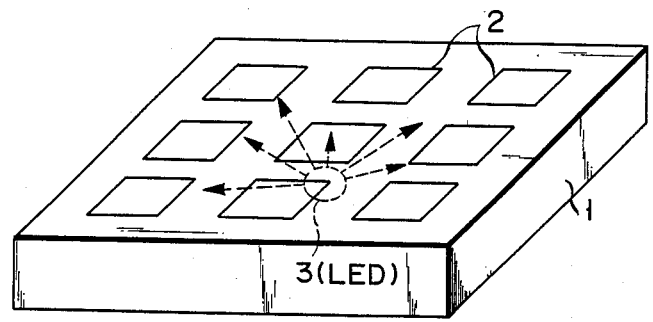
FIG. 1 shows an integrated optical and electric circuit device embodying the present invnetion.

Referring now to FIG. 1, there is shown a semiconductor integrated circuit device according to one embodiment of the present invention which is adapted for the optical distribution of a clock signal serving as a common signal for logic circuit units. According to this device, for instance, a plurality of logic circuit units 2 which are made operative in response to the clock signal are integrated on a gallium arsenide (GaAs) semiconductor substrate 1 and a semiconductor light emitting device 3 is formed substantially in the central portion of the substrate. Although only one light emitting device is shown, a plurality of light emitting devices may be formed. Each logic circuit unit has a semiconductor light detecting device coupled to one or more FETs to perform a logic function. The semiconductor light emitting device 3 is powered by a clock signal source to emit light and a light clock signal is commonly applied to the logic circuit units 2 through the GaAs substrate 1 which permits light to pass therethrough. The light detecting devices coupled to the respective logic circuit units are switched to on and off in response to the light clock signal. According to this arrangement, the light detecting devices of the logic circuit units are activated by the light clock signal, so that each logic circuit unit operates in a similar manner to a case where an electrical clock signal is applied.

Figure 2:
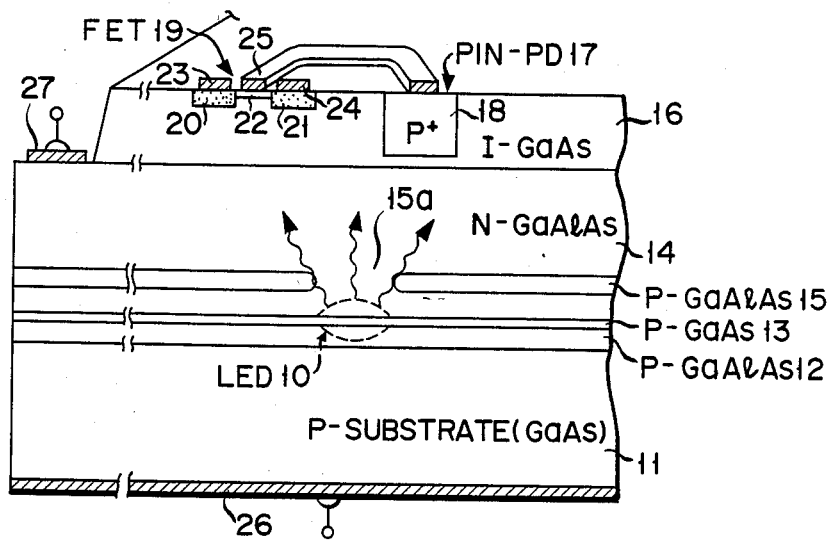
FIG. 2 is a cross sectional view of an integrated circuit device according to one embodiment of the invention.

FIG. 2 schematically shows a semiconductor integrated circuit device according to a first embodiment of the present invention in which a light emitting diode (LED) of double heterojunction structure, a photo diode of PIN structure and transistors (FETs) constituting logic circuits are monolithically formed on a substrate.

In this embodiment, a P-type GaAs substrate 11 is used as an integrated circuit substrate. A light emitting diode 10 of a double heterojunction structure consisting of GaAs and GaAlAs is formed on the substrate 11. More specifically, a first cladding layer 12 consisting of P-type GaAlAs, an active layer 13 consisting of P-type GaAs and a second cladding layer 14 consisting of N-type GaAlAs are sequentially formed on the substrate 11. The active layer 13 may be P-type GaAlAs doped with a restricted quantity of Al. It is desired that the LED 10 be of an internal confinement type to raise the light emitting efficiency. Therefore, a confinement layer 15 consisting of P-type GaAlAs having a confining area 15a in the second cladding layer 14 is formed. A diode current concentrically flows through the confining area 15a of the confinement layer 15, so that a portion of the active layer 13 just under the confining area 15a is activated to emit light.

An upper layer 16 consisting of I (intrinsic) type GaAs is formed on the second cladding layer 14 and is used as a substrate for FETs of logic circuit units. A photo diode 17 of the PIN structure has a P+ region 18, acting as its anode, formed in the upper layer portion 16 adjacent to its major surface by the diffusion of impurities or ion implantation technology. To raise light detecting efficiency, the P+ region 18 is deeply formed in the upper layer 16. Source and drain regions of the FETs of the circuit units are relatively shallowly formed adjacent to the major surface of the upper layer portion 16 using the ion implantation technology. In the Figure, reference numerals 20, 21 and 22 denote a source region, a drain region and a channel region of the first stage FET 19 of a circuit unit. The source region 20 and drain region 21 are respectively coupled to a source electrode 23 and a drain electrode 24 formed on the major surface of the upper layer 16. A gate electrode 25 is formed on the channel region 22 between the source region 20 and the drain region 21 and is coupled to the P+ region 18 of the photo diode 17. An electrode layer 26 serving as an anode electrode of the LED 10 is formed on the lower surface of the substrate 11. An electrode layer 27 serving as a cathode electrode of the LED 10 and the photo diode 17 is formed on the second cladding layer 14 as shown.

In the arrangement shown, the LED 10 is formed substantially at the central portion of a plane of the integrated circuit chip and the P+ region 18 of the photo diode 17 is deeply formed. Therefore, the photo diode 17 can efficiently respond to the light signal at any location where a light input is required. When the I-type GaAs layer 16 has a thickness of a few micrometers, light emitted from the LED 10 is almost absorbed by this layer, so that the light will not reach the FET of the logic circuit unit.

Figure 3:
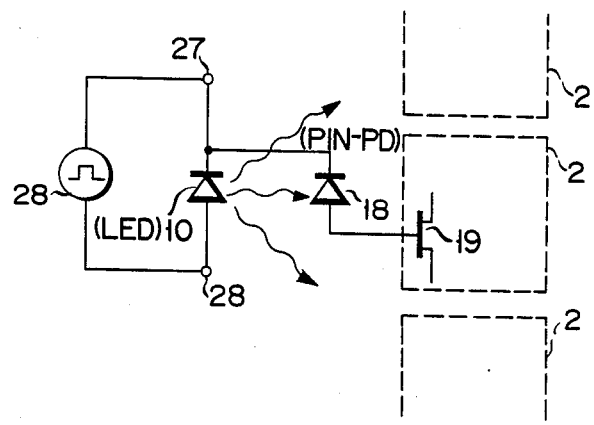
FIG. 3 shows an equivalent circuit of the arrangement in FIG. 2.

FIG. 3 shows an equivalent circuit of the arrangement in FIG. 2. In the Figure, the parts and components corresponding to those in FIG. 2 are designated by the same reference numerals. The electrode layer 27 may be adapted for connection to ground or reference potential source. In the case of a digital integrated circuit, the LED 10 is driven by a clock signal source 28 to emit a light clock signal. The photo diode 17 of each logic circuit unit is switched on and off in response to the light clock signal. Thus, the logic circuit units can desirably operate in response to the light clock signal.

An example of thicknesses of the respective layers in FIG. 2 will be mentioned below. The first cladding layer 12 is about 3 μm. The active layer 13 is about 1 μm. The second cladding layer 14 is about 10 μm. The narrow hole layer 15 is about 2 μm. And the upper layer 16 is about 5 μm.

Figure 4:
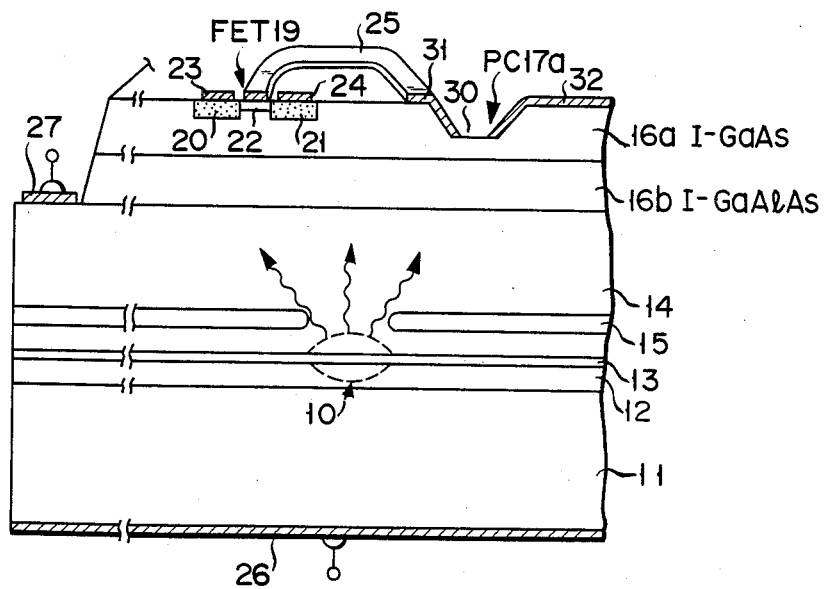
FIG. 4 is a cross sectional view similar to FIG. 2 of an integrated circuit device according to another embodiment of the invention.

FIG. 4 shows another embodiment of the invention in which a photo conductor which can be easily manufactured is used as a light detecting device. In FIG. 4, the same parts and components as those shown in FIG. 2 are designated by the same reference numerals and their descriptions are omitted. In this embodiment, the layer on the second cladding layer 14 has a double layered structure consisting of an I-type GaAs layer 16a and an I-type GaAlAs layer 16b. Each region of the FETs of the respective logic circuits is formed in the I-type GaAs layer 16a as in the foregoing embodiment. A photo conductor 17a is simply formed by arranging electrode layers 31 and 32 along a concave portion 30 formed in the I-type GaAs layer 16a as shown. The concave portion 30 is formed deeper than the source and drain regions of the FET. The electrode 31 of the photo conductor 17a is coupled to the gate electrode 25 of the first stage FET 19. The other electrode 32 is connected to a power source together with the FETs. When light is received from the LED 10, the resistance of the I-type GaAs layer 16a decreases, so that the resistance between the electrodes 31 and 32 of the photo conductor 17a is reduced, causing a signal to flow through the gate electrode 25 of the FET 19.

In general, the potential of the photo conductor 17a at the I-type GaAs layer 16a and the potential of the second cladding layer 14 differ from each other. The I-type GaAlAs layer 16b is provided to isolate the photo conductor 17a from the second cladding layer 14. In the case where the isolation of the I-type GaAlAs layer 16b is insufficient, a P-type GaAlAs layer may be provided between the layer 16b and the second cladding layer 14 as necessary.

For example, the I-type GaAs layer 16a has a thickness of about 5 μm and the I-type GaAlAs layer 16b has a thickness of about 5 μm. As described above, the I-type GaAs layer 16a is relatively thick and also the photo conductor 17a is hollow, so that the photo conductor can efficiently respond to the light and the FETs of the logic circuit units are not essentially influenced by light.

Figure 5:
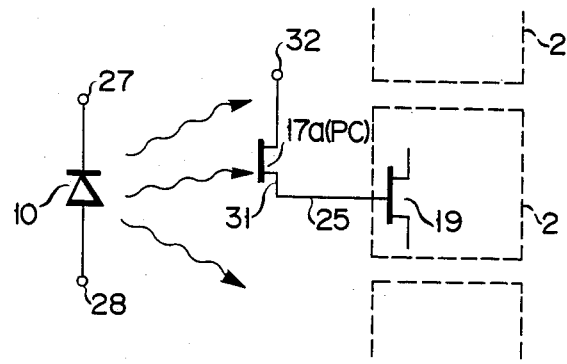
FIG. 5 is an equivalent circuit diagram of the arrangement in FIG. 4.

FIG. 5 shows an equivalent circuit of the arrangement in FIG. 4. As will be apparent from this circuit, in this embodiment, the LED 10 and circuit unit 2 have not a common point in terms of the potential.

In the foregoing embodiments, the LED is used as a light emitting device. However, the response speed of LEDs is usually about 100 MHz excluding an extremely high-speed device in which an output power is ignored. Therefore, the LED is acceptable when considering that system clocks of recent microcomputers or office comptuers are below 10 MHz. When a higher-speed light clock is demanded, a semiconductor laser can be used.

Figure 6:
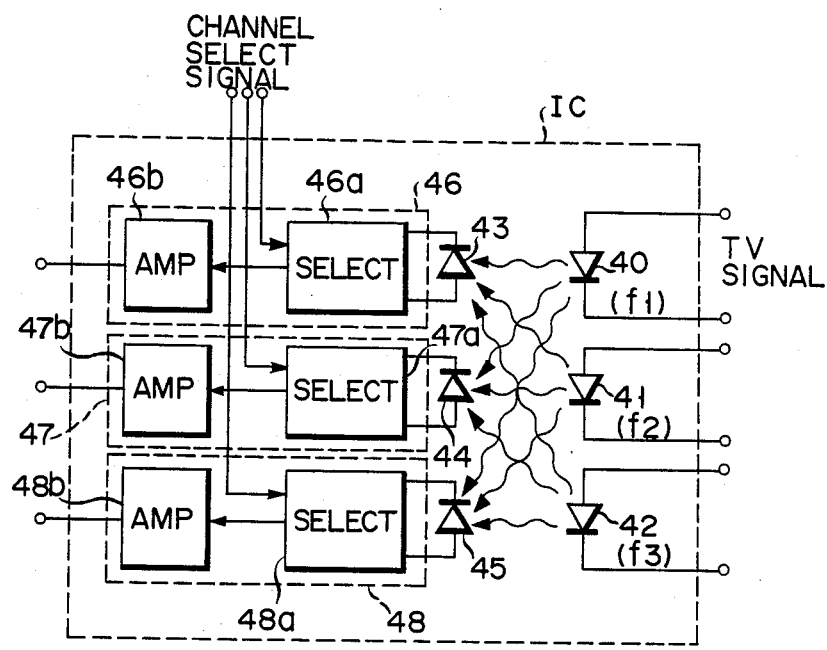
FIG. 6 schematically shows an arrangement of an integrated video selector to which the invention is applied.

Another embodiment of the invention will now be described with reference to FIG. 6. This embodiment is applied to an IC video selector used in a subscriber's television system. In this video selector, a plurality of semiconductor light emitting devices 40, 41 and 42, a plurality of semiconductor light detecting devices 43, 44 and 45, and video selecting circuit units 46, 47 and 48 coupled to the corresponding semiconductor light detecting devices are monolithically formed on a semiconductor substrate. The semiconductor light emitting devices 40, 41, and 42 are respectively driven by carrier signals having frequencies of $f_1$, $f_2$ and $f_3$ and carrying video signals. Light video signals generated from the semiconductor light emitting devices are commonly received by each of the semiconductor light detecting devices 43, 44 and 45. The common signal in this embodiment is a video signal, particularly, video superposed signals from which a desired one is selected. The video selecting circuits 46, 47 and 48 comprise video selecting devices 46a, 47a and 48a and amplifiers (or demodulators) 46b, 47b and 48b, respectively. Each of the video selecting devices 46a, 47a and 48a receives a channel selection signal from a subscriber and selects a desired video signal from the video superposed signals from the corresponding semiconductor light detecting device.

In the integrated circuit devices of the invention described above, the GaAs system is used as substrate material. Alternatively, the InP system may be used. The common signal may be a digital signal or an analog signal.

What is claimed is:

1. An integrated optical and electric circuit device comprising:
    a semiconductor integrated circuit substrate in which a plurality of circuit units are integrated near a major surface of said substrate, said substrate having a property to allow light to pass therethrough and said circuit units coupled so as to to receive a common signal;
    at least one semiconductor light emitting device formed in said semiconductor integrated circuit substrate, said light emitting device being activated by a common signal source to emit light which passes through said semiconductor substrate; and
    semiconductor light detecting devices coupled to said circuit units and formed in said semiconductor integrated circuit substrate, each of said light detecting devices being responsive to the light emitted from said semiconductor light emitting device to bring a corresponding circuit unit into a common signal receiving state.

2. A circuit device according to claim 1, wherein each of said circuit units is a logic circuit and said common signal is a clock signal to drive said logic circuit.

3. A circuit device according to claim 1, wherein each of said circuit units includes a transistor having a control electrode connected to receive a clock signal, and said semiconductor light detecting device is connected between said control electrode of said transistor and a constant potential source.

4. A circuit device according to claim 1, wherein said semiconductor light emitting device is a light emitting diode.

5. A circuit device according to claim 1, wherein said semiconductor light detecting device is a photo diode of a PIN structure.

6. A circuit device according to claim 1, wherein said semiconductor light detecting device is a photo conductor.

7. A circuit device according to claim 1, wherein said semiconductor integrated circuit substrate is formed of gallium arsenide.

8. An integrated optical and electric circuit device comprising:
    an integrated circuit substrate having a first conductivity type and formed of a first semiconductor material;
    a semiconductor light emitting diode formed on said integrated circuit substrate, said semiconductor light emitting diode hving an active layer having said first conductivity type and formed of a first or second semiconductor material, a first cladding layer formed between said active layer and said semiconductor circuit substrate, said first cladding layer having said first conductivity type and formed of said second semiconductor material, and a second cladding layer formed on said active layer, said second cladding layer having said second conductivity type and formed of said second semiconductor material;
    an upper layer formed of said first semiconductor material of an intrinsic type and formed on said second cladding layer;
    a plurality of field effect transistors formed in said upper layer, each of said transistors having a source region, a drain region with source and drain electrodes formed on said source and drain regions in said upper layer and a gate electrode which is formed on said upper layer;
    a photodetective region of said first conductivity type formed in said upper layer and coupled to said gate electrode of one of said field effect transistors; and
    first and second electrodes coupled to said integrated circuit substrate and said second cladding layer, respectively.

9. A circuit device according to claim 8, wherein said first semiconductor material is formed of gallium arsenide and said second semiconductor material is formed of gallium aluminum arsenide.

10. A circuit device according to claim 8, wherein said first conductivity type region is formed deeper than said source region and drain region of said field effect transistor in said upper layer.

11. A circuit device according to claim 8, wherein a confinement layer having a confining area is formed in said second cladding layer.

12. An integrated optical and electric circuit device comprising:
    an integrated circuit substrate having a first conductivity type and formed of a first semiconductor material;
    a semiconductor light emitting diode formed on said integrated circuit substrate, said semiconductor light emitting diode having an active layer having said first conductivity type and formed of a first or second semiconductor material, a first cladding layer formed between said active layer and said semiconductor circuit substrate, said first cladding layer having said first conductivity type and formed of a second semiconductor material, and a second cladding layer formed on said active layer, said second cladding layer having a second conductivity type and formed of said second semiconductor material;
    first and second upper layers formed on said second cladding layer and formed of said first and second semiconductor materials of an intrinsic type, respectively, said second upper layer being formed between said first upper layer and said second cladding layer;
    a plurality of field effect transistors formed in said first upper layer, each of said transistors having a source region, a drain region with source and drain electrodes formed on said source and drain regions in said upper layer and a gate electrode formed on said first upper layer;
    photo conductor means formed on said first upper layer, said photo conductor means having first and second electrodes formed apart on said first upper layer, and said first electrode being coupled to said gate electrode of said field effect transistor; and
    electrodes coupled to said integrated circuit substrate and said second cladding layer, respectively.

13. A circuit device according to claim 12, wherein said photo conductor means has a concave portion formed in said first upper layer separate from that portion of said first upper layer in which said source and drain regions of said transistor are rormeu, and said first and second electrodes are formed along said concave portion.

14. A circuit device according to claim 13, wherein said concave portion is formed in said first upper layer deeper than said source region and said drain region.

15. A circuit device according to claim 12, wherein said first semiconductor material is formed of gallium arsenide and said second semiconductor material consists of gallium aluminum arsenide.

16. A circuit device according to claim 12, wherein a confinement layer having a confining area is formed in said second cladding layer.

* * * * *